United States Patent [19]

Page

[11] 4,435,684
[45] Mar. 6, 1984

[54] VIDEO AMPLIFIER MUTE CIRCUIT

[75] Inventor: Ronald W. Page, Sunnyvale, Calif.

[73] Assignee: National Semiconductor Corporation, Santa Clara, Calif.

[21] Appl. No.: 366,944

[22] Filed: Apr. 9, 1982

[51] Int. Cl.³ .............................................. H03F 3/45
[52] U.S. Cl. ........................................ 330/51; 330/254
[58] Field of Search ......................... 330/51, 254, 278; 455/174, 194, 212

[56] References Cited

U.S. PATENT DOCUMENTS 4,366,442 12/1982 Yanada .................................. 330/51

Primary Examiner—James B. Mullins
Assistant Examiner—Steven J. Mottola
Attorney, Agent, or Firm—Gail W. Woodward; Paul J. Winters; Michael J. Pollock

[57] ABSTRACT

A wide bandwidth amplifier is shown along with a muting circuit. The output shift between normal operation and mute is kept very small. The amplifier is useful in video disk and audio signal reproduction.

4 Claims, 1 Drawing Figure

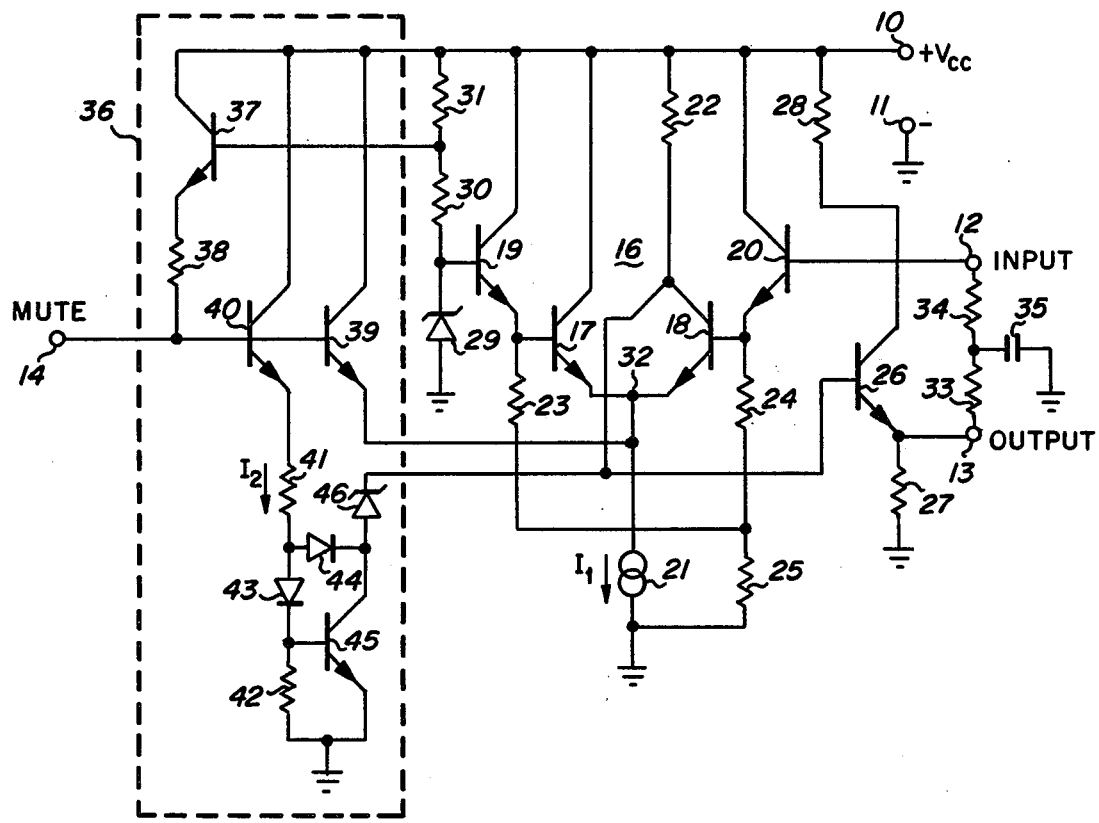

VIDEO AMPLIFIER MUTE CIRCUIT

BACKGROUND OF THE INVENTION

Video amplifiers are usually constructed in integrated circuit (IC) form as differential amplifiers even if signal ended input and output is to be employed. Typically, such an amplifier is stabilized for dc by means of a low-pass filter in a negative feedback loop. Since the typical IC employs NPN transistors in such an amplifier, the gain-bandwidth product is quite large and well controlled. In many applications it is desirable to mute the amplifier by reducing its gain to zero or a very low value. For example, in the video disk playback art it is desirable to turn the video amplifier off (or mute it) when the tone arm (pickup) is lifted away from the disk surface. This ensures that when no signal is being picked up the display screen will go blank and that no randomly picked-up signals are reproduced. In such an application it is desirable that the muting circuit does not appreciably shift the amplifier d-c output.

SUMMARY OF THE INVENTION

It is an object of the invention to provide a video amplifier circuit that can be muted without substantially shifting its d-c output.

It is a further object of the invention to provide a high gain IC wide bandwidth amplifier circuit that can be muted in response to a control signal without appreciably changing the d-c output voltage.

It is a still further object of the invention to employ an output clamp in a high gain wide bandwidth amplifier wherein the clamp is activated when the amplifier is muted so that the d-c output remains at substantially the same level whether muted or not.

These and other objects are achieved in the following manner. A differential amplifier is configured to have a high gain and a single ended output. Tail current is supplied by way of a conventional current source. The noninverting amplifier input is coupled to a Zener diode which has a stable and relatively low breakdown voltage. The inverting amplifier input constitutes the video amplifier input. The output of the differential amplifier is coupled via an emitter follower buffer to provide the video amplifier output. Typically the d-c operating point is stabilized by coupling a low pass filter between the video amplifier input and output. A mute circuit, which is turned on in the presence of a mute signal, operates a pair of transistors. The first transistor is connected to shunt the differential amplifier tail current thereby reducing its gain to substantially zero. The second transistor turns on a clamp circuit connected to a differential amplifier output. The clamp includes a Zener diode that matches the Zener diode coupled to the noninverting input and a biasing circuit that sets up a voltage drop equal to the emitter to base potential of a conducting transistor. Thus the clamp holds the differential amplifier output at its normal operating level.

BRIEF DESCRIPTION OF THE DRAWING

The single FIGURE of drawing is a schematic diagram of the circuit of the invention.

DETAILED DESCRIPTION OF THE INVENTION

With reference to the schematic of the drawing, a source of operating power is connected between the $+V_{CC}$ terminal 10 and ground 11. A video signal applied to input terminal 12 will appear amplified at output terminal 13. A mute signal applied at terminal 14 will permit reducing the amplifier gain to close to zero when terminal 14 is open. When terminal 14 is low (close to ground), as would be obtained when a conducting transistor (not shown) is coupled between terminal 14 and ground, the amplifier will operate normally.

The heart of the circuit is a conventional differential amplifier 16, which is composed of transistors 17–20. Transistors 17 and 18 have their emitters coupled together and to tail current source 21 which conducts $I_1$ to ground. Resistor 22 provides a single ended output. Emitter follower transistors 19 and 20 directly drive the bases of transistors 17 and 18 respectively. Resistors 23–25 provide return paths to ground for the emitters of transistors 19 and 20.

Transistor 26 is connected as an emitter follower output buffer between differential amplifier 16 and output terminal 13. Resistor 27 is the emitter follower load, and resistor 28 is a current limiting element.

Input terminal 12 is directly connected to the inverting input of amplifier 16 at the base of transistor 20. The noninverting input, at the base of transistor 19, is biased by Zener diode 29. This diode is of conventional subsurface or buried construction and is designed to have a stable reverse breakdown of about 5.6 volts. Diode 29 is biased into reverse breakdown by the current flowing in resistors 30 and 31. The voltage at node 32 in normal operation is two diodes below the Zener voltage or about 4.2 volts. In this quiescent state the circuit will be balanced when input terminal 12 is also biased at 5.6 volts. When the collector of transistor 18 is at about 6.3 volts, output terminal 13 will also be about 5.6 volts. These bias conditions will be forced when a low pass filter composed of resistors 33 and 34 along with capacitor 35 is coupled as shown between output terminal 13 and input terminal 12. Such negative feedback will act to stabilize the d-c operating bias of the circuit. The d-c feedback loop will drive the base of transistor 20 until the voltage at the collector of transistor 18 is about one $V_{BE}$ above the voltage at the base of transistor 19. Thus the output at the emitter of transistor 26 will tend to match the Zener diode 29 voltage.

Thus far a relatively conventional differential video amplifier has been described. Its performance is accordingly straightforward. With a load resistor 22 of about ten kohms, such a circuit will have a voltage gain of typically 110 (about 41 db).

With the circuit of the drawing the foregoing operation will proceed as long as terminal 14 is low. This state turns off mute circuit 36. However when terminal 14 is allowed to float transistor 37 will pull terminal 14 high through resistor 38. Since the base of transistor 37 is returned to a potential well above the Zener diode voltage, transistor 37 will act to pull terminal 14 toward a potential that is also well above the Zener voltage level.

This action turns both transistors 39 and 40 on. Transistor 39 acts to shunt $I_1$ around amplifier 16 so as to turn it off. In effect transistor 39 will pull node 32 up sufficiently to turn transistors 17 and 18 off. This mutes video amplifier 16.

Transistor 40, when turned on, causes $I_2$ to flow through resistor 41. A portion of $I_2$ flows in the series combination of resistor 42 and diode 43. While a small portion of $I_2$ flows in diode 43 and resistor 42, the major portion of $I_2$ flows in diode 44 and transistor 45. The proportioning of $I_2$ will be such that the voltage drop across resistor 42 will turn transistor 45 on to a degree that will account for most of $I_2$. It can be seen that both diodes 43 and 44 are in forward conduction. This clamps the collector of transistor 45 at one $V_{BE}$. Transistor 45 being on also conducts the current flowing in Zener diode 46 which is reverse biased from the $V_{CC}$ bus through resistor 22. Thus the collector of transistor 18 is clamped at a voltage level equal to the Zener voltage of diode 46 plus one $V_{BE}$. This is about 6.3 volts which is very close to the normal video amplifier operating level. As a practical matter, if Zener diodes 29 and 46 are of matched construction, the shift in output voltage at terminal 13 when going from normal to mute will be on the order of a few millivolts which produces acceptable performance.

In another design of a prior art muting circuit the emitters of transistors 39 and 40 were returned directly to the bases of transistors 17 and 18. In this design the clamp circuit, responsive to $I_2$, was omitted. Muting action was accomplished by raising the common mode level at the bases of transistors 17 and 18 which acts to turn off transistors 19 and 20 thereby disrupting, or muting, the video. Since a common mode shift will not directly affect $I_1$, there will be no first order shift in the collector voltage of transistor 18. However, since transistors 39 and 40 do not have identical properties, when they are turned on, there will be an offset in their emitter voltages. Also since transistors 17 and 18 are not identical, they too may produce an offset. In the typical IC manufacturing processes matched NPN transistors can develop offsets of up to about 3 millivolts. Therefore in a worst case situation (one in which the above two offsets add) the total offset can be as high as 6 millivolts. Since this offset will be multiplied by the gain of the amplifier, the worst case offset shift at the collector of transistor 18 (and therefore output terminal 13) will be $\pm 660$ millivolts. This magnitude of shift is unacceptable. It is clear that, when using this kind of circuit design, there will be unacceptable circuits that are related solely to the random nature inherent in IC fabrication. Using the circuit of the invention, as described above, this sort of random failure to meet performance requirements is avoided.

EXAMPLE

The circuit of the drawing was fabricated using conventional junction isolated IC construction. The Zener diodes employed conventional structures having subsurface breakdown characteristics. The conventional diodes were NPN transistors with their collectors shorted to their bases. The following component values were employed:

| COMPONENT | VALUE | UNITS |
| --- | --- | --- |
| Source 21 | 1.1 | Milliamperes |
| Resistors 22,23,24 | 10K | Ohms |

| COMPONENT | VALUE | UNITS |
| --- | --- | --- |
| Resistors 25,38 | 20K | Ohms |
| Resistor 27 | 6K | Ohms |
| Resistor 28 | 300 | Ohms |
| Zener diodes 29,46 | 5.6 | Volts |
| Resistors 30,42 | 1.4K | Ohms |
| Resistor 31 | 3.8K | Ohms |
| Resistor 33 | 12K | Ohms |
| Resistor 34 | 910 | Ohms |
| *Capacitor 35 | 1 | Microfarad |
| Resistor 41 | 4.5K | Ohms |

*off-chip component

The amplifier displayed a signal gain of about 41 db between terminals 12 and 13. Typically the output shift between normal and mute was less than 20 millivolts.

The invention has been described and a working example given. When a person skilled in the art reads the foregoing, equivalents and alternatives, within the spirit and intent of the invention, will become apparent. For example, while the circuit has been described for use in a video application, it can also be used in audio or high fidelity applications. Here the mute operation would produce a click or pop without the invention. Accordingly, it is intended that the scope of the invention be limited only to the claims that follow.

I claim:
1. A wide bandwidth amplifier circuit which includes a high gain amplifier capable of being muted in response to a muting signal without changing its d-c output level, said circuit comprising:
   a differential amplifier having a source of tail current, an inverting input terminal, a noninverting input terminal, and an output;
   means for returning said noninverting input to a source of constant bias potential;
   means for coupling said inverting input to a source of signal to be amplified;
   means for shunting said tail current around said differential amplifier in response to said muting signal; and
   means for clamping said output to a d-c level, equal to the normal output level of said differential amplifier in its active state, in response to said muting signal.
2. The amplifier circuit of claim 1 wherein said source of constant bias includes a Zener diode biased into reverse breakdown and said means for clamping includes a matched Zener diode.
3. The amplifier circuit of claim 2 wherein said differential amplifier includes a cascaded emitter follower directly coupled to its output to provide a low impedance, signal output source and a low pass filter coupled between said emitter follower output and said inverting input whereby the operating bias of said circuit is stabilized.
4. The amplifier circuit of claim 2 wherein said means for clamping further includes a transistor that is turned on in response to said muting signal and is biased to develop a voltage drop when turned on that is equal to the base to emitter voltage drop of a conducting transistor.

* * * * *